United States Patent
Ho et al.

(10) Patent No.: US 10,608,592 B2
(45) Date of Patent: Mar. 31, 2020

(54) LINEAR AMPLIFIER HAVING HIGHER EFFICIENCY FOR ENVELOPE TRACKING MODULATOR

(71) Applicant: MEDIATEK INC., Hsin-Chu (TW)

(72) Inventors: Chen-Yen Ho, New Taipei (TW); Yu-Hsin Lin, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/871,045

(22) Filed: Jan. 14, 2018

(65) Prior Publication Data

US 2018/0241351 A1 Aug. 23, 2018

Related U.S. Application Data

(60) Provisional application No. 62/462,360, filed on Feb. 23, 2017.

(51) Int. Cl.
| | |
|---|---|
| H03F 3/45 | (2006.01) |
| H03F 1/02 | (2006.01) |
| H03F 1/22 | (2006.01) |
| H03F 1/48 | (2006.01) |
| H03F 3/30 | (2006.01) |

(52) U.S. Cl.
CPC .......... *H03F 1/0222* (2013.01); *H03F 1/223* (2013.01); *H03F 1/483* (2013.01); *H03F 3/303* (2013.01); *H03F 3/45183* (2013.01); *H03F 3/45237* (2013.01); *H03F 2200/102* (2013.01); *H03F 2200/252* (2013.01); *H03F 2203/30084* (2013.01); *H03F 2203/30096* (2013.01); *H03F 2203/30099* (2013.01); *H03F 2203/30117* (2013.01); *H03F 2203/30129* (2013.01); *H03F 2203/30132* (2013.01); *H03F 2203/45674* (2013.01); *H03F 2203/45702* (2013.01); *H03F 2203/45726* (2013.01)

(58) Field of Classification Search
CPC .................................. H03F 3/2176; H03F 3/45
USPC .......................................... 330/310, 311, 253
See application file for complete search history.

(56) References Cited

U.S. PATENT DOCUMENTS

| | | |
|---|---|---|
| 5,912,583 A | 6/1999 | Pierson |
| 7,425,868 B2 | 9/2008 | Ju |
| 7,768,348 B2 * | 8/2010 | Banba ............... H03F 3/195 330/253 |
| 7,888,995 B2 * | 2/2011 | Motoyui ........... H03F 3/45183 330/253 |

(Continued)

OTHER PUBLICATIONS

Paek, "An RF-PA Supply Modulator Achieving 83% Efficiency and −136dBm/Hz Noise for LTE-40MHz and GSM 35dBm Applications", 2016 IEEE International Solid-State Circuits Conference.

(Continued)

*Primary Examiner* — Henry Choe
(74) *Attorney, Agent, or Firm* — Winston Hsu

(57) ABSTRACT

A linear amplifier is provided to have higher efficiency for an envelope tracking modulator. In one embodiment, a first stage amplifier circuit can be simply operated in a high gain mode or a high bandwidth mode for different applications, without using large chip area. In another embodiment, an output stage has a cascode structure whose dynamic range is controlled according to a voltage level of a supply voltage, to make a core device within the output stage have better protection and suitable dynamic range.

20 Claims, 2 Drawing Sheets

(56) References Cited

U.S. PATENT DOCUMENTS

| | | | |
|---|---|---|---|
| 8,922,276 B2* | 12/2014 | Iwamoto | H03F 3/45179 |
| | | | 330/9 |
| 9,484,867 B2 | 11/2016 | Arcudia | |
| 2005/0225390 A1 | 10/2005 | Klein | |
| 2006/0267685 A1 | 11/2006 | Alenin | |
| 2006/0284671 A1 | 12/2006 | Ohba | |
| 2012/0133437 A1* | 5/2012 | Shionoiri | G11C 7/062 |
| | | | 330/253 |
| 2013/0057345 A1* | 3/2013 | Kimura | G11C 19/184 |
| | | | 330/253 |
| 2013/0113524 A1 | 5/2013 | Rueger | |
| 2017/0026004 A1 | 1/2017 | Stuenkel | |

OTHER PUBLICATIONS

Riehl, "An AC-Coupled Hybrid Envelope Modulator for HSUPA Transmitters with 80% Modulator Efficiency", 2013 IEEE International Solid-State Circuits Conference.

Chowdhury, "A Fully Integrated Reconfigurable Wideband Envelope-Tracking SoC for High-Bandwidth WLAN Applications in a 28nm CMOS Technology", 2017 IEEE International Solid-State Circuits Conference.

* cited by examiner

LINEAR AMPLIFIER HAVING HIGHER EFFICIENCY FOR ENVELOPE TRACKING MODULATOR

CROSS REFERENCE TO RELATED APPLICATIONS

This application claims the priority of U.S. Provisional Application No. 62/462,360, filed on Feb. 23, 2017, which is included herein by reference in its entirety.

BACKGROUND

In a transmitter of a portable electronic device, a power amplifier generally requires much power to convert a low-power radio-frequency (RF) signal into a higher power signal. To lower power consumption of the power amplifier, an envelope tracking modulator (ETM) is used to track the signal envelope to dynamically adjust a supply voltage of the power amplifier and related circuits. In a long-term evolution advanced (LTE-A) service, because of higher data rate with high peak-to-average power ratio (PAPR), the envelope tracking modulation becomes more complicated, and efficiency of the power amplifier may be degraded. In addition, the power amplifier tends to function less efficiently when it is configured to cover a wide frequency range, therefore, the efficiency of power amplifier is difficult to be optimized because a contiguous carrier aggregation (CCA) in the LTE-A system requires a higher bandwidth ETM to fully track the envelope waveform.

SUMMARY

It is therefore an objective of the present invention to provide a linear amplifier, which can cover a wide frequency range (e.g. 80 MHz) and work efficiently, to solve the above-mentioned problems.

According to one embodiment of the present invention, a linear amplifier comprises a first stage amplifier circuit, and the first stage amplifier circuit comprises two input transistors, a first, a second circuit and switch module, where the two input transistors is arranged for receiving a differential input signal to generate an amplified differential signal, wherein each of the two input transistors comprises a gate electrode, a first electrode and a second electrode, the gate electrode is used to receive the differential input signal, the first electrode is coupled to a supply voltage, and the second electrode is used to output the amplified differential signal; and the switch module is arranged for connecting the second electrodes of the two input transistors to the first circuit or the second circuit. In addition, a bandwidth and a gain of the linear amplifier when the second electrodes of the two input transistors connect to the first circuit are different from the bandwidth and the gain of the linear amplifier when the second electrodes of the two input transistors connect to the second circuit.

According to another embodiment of the present invention, a linear amplifier comprises at least one amplifier circuit and an output stage. The amplifier circuit is arranged for receiving an differential input signal to generate a differential driving signal. The output stage is coupled to the amplifier circuit and supplied by a supply voltage, and is arranged for generating an output signal according to the differential driving signal, wherein the output stage has a cascode structure whose dynamic range is controlled according to a level of the supply voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
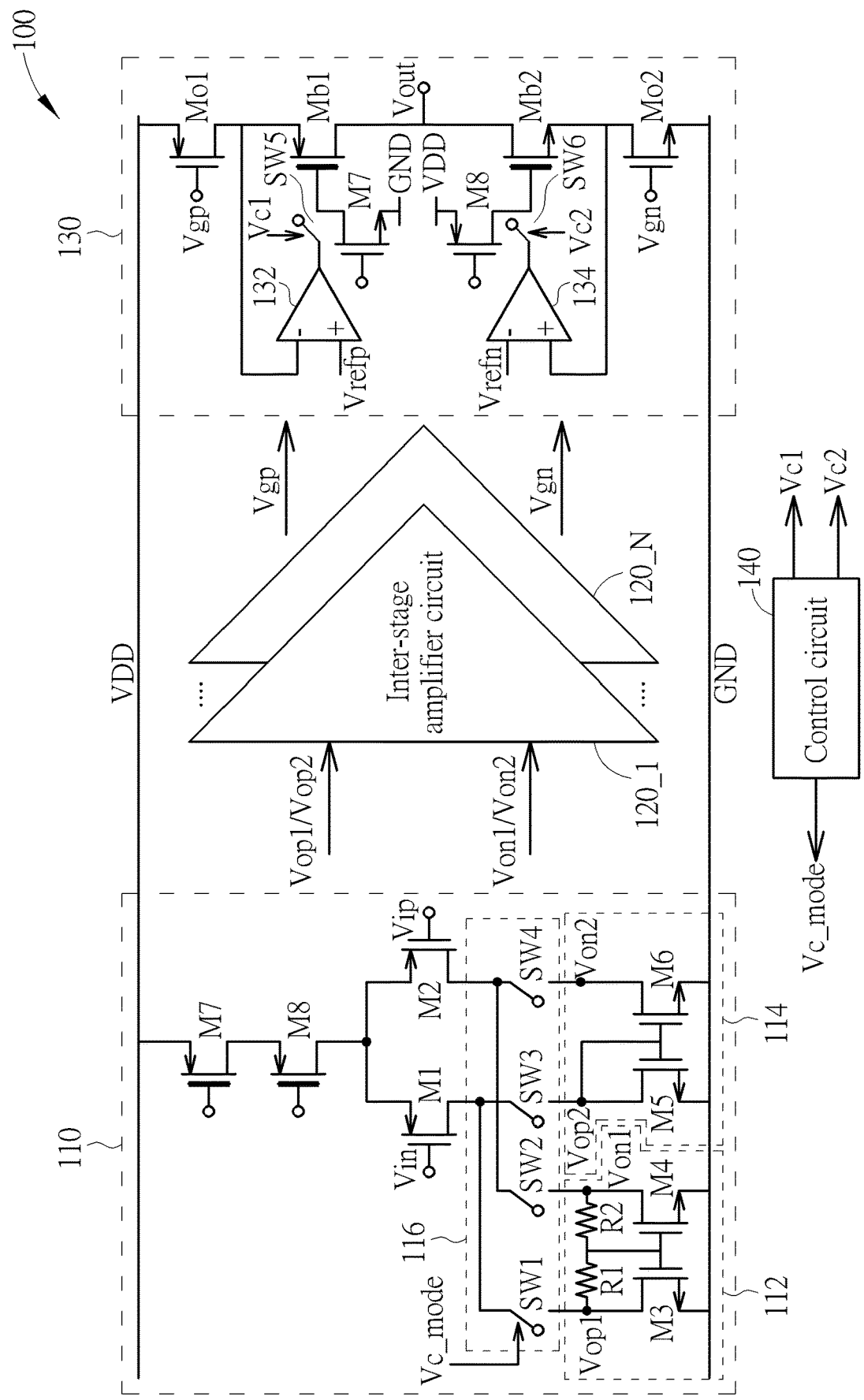
FIG. 1 is a diagram illustrative a linear amplifier according to one embodiment of the present invention.

FIG. 1 is a diagram illustrative a linear amplifier 100 according to one embodiment of the present invention. In this embodiment, the linear amplifier is a class AB amplifier used for an envelope tracking modulator in a power amplifier system. As shown in FIG. 1, the linear amplifier 100 comprises a first stage amplifier circuit 110, at least one inter-stage amplifier circuit (in this embodiment, inter-stage amplifier circuits 120_1-120_N) and an output stage 130. In the embodiment shown in FIG. 1, the first stage amplifier circuit 110 can selectively operate in a high bandwidth mode or a high gain mode for different applications, and the output stage 130 can have different dynamic ranges by referring to a voltage level of a supply voltage VDD, to optimize the efficiency of the power amplifier system.

The first stage amplifier circuit 110 comprises two input transistors M1 and M2, a first circuit 112, a second circuit 114, a switch module 116, and two cascode transistors M7 and M8. In this embodiment, the input transistors M1 and M2 connect to only one of the first circuit 112 and the second circuit 114 to make the first stage amplifier circuit 110 or the linear amplifier 100 to have different bandwidths and gains. In detail, the first circuit 112 comprises two transistors M3 and M4 and two resistors R1 and R2, where a drain electrode of the transistor M3 is coupled to a drain electrode of the input transistor M1 via a switch SW1 of the switch module 116, a drain electrode of the transistor M4 is coupled to a drain electrode of the input transistor M2 via a switch SW2 of the switch module 116, the resistor R1 is coupled between the drain electrode and a gate electrode of the transistor M3, and the resistor R2 is coupled between the drain electrode and a gate electrode of the transistor M4. The second circuit 114 comprises two transistors M5 and M6, where a drain electrode of the transistor M5 is coupled to a drain electrode of the input transistor M1 via a switch SW3 of the switch module 116, and a drain electrode of the transistor M6 is coupled to a drain electrode of the input transistor M2 via a switch SW4 of the switch module 116. In this embodiment, because of the resistors R1 and R2, the equivalent impedance of the first circuit 112 is lower than the equivalent impedance of the second circuit 114. Therefore, because a dominate pole is determined by a transconductance (gm) of the input transistors M1 and M2 and the equivalent impedance of the first/second circuit 112/114, the first stage amplifier circuit 110 or the linear amplifier 100 has a higher bandwidth and lower gain when the input transistors M1 and M2 are coupled to the first circuit 112, and the first stage amplifier circuit 110 or the linear amplifier 100 has a narrower bandwidth and higher gain when the input transistors M1 and M2 are coupled to the second circuit 114.

In a 4G, 4G+ or pre-5G cellular system, the LTE has two system modes: time division duplex (TDD) mode and frequency division duplex (FDD) mode. The first stage amplifier circuit 110 is controlled to operate in the high gain mode when a cellular device comprising the linear amplifier 100 operates in the scenario which is sensitive to receiver band noise (e.g. FDD mode). In detail, when the linear amplifier 100 operates in the high gain mode, a control circuit 140 may generate a mode control signal Vc_mode to switch on the switches SW3 and SW4, and to switch off the switches SW1 and SW2, to make the input transistors M1 and M2 connect to the second circuit 114. In addition, for a contiguous carrier aggregation used for higher uplink data rate such as 2CCA, 3CCA and/or 4CCA (e.g. TDD mode), the high bandwidth and tracking capability are the main design consideration, and the first stage amplifier circuit 110 is controlled to operate in the high bandwidth mode. In detail, when the linear amplifier 100 operates in the high bandwidth mode, the control circuit 140 may generate the mode control signal Vc_mode to switch on the switches SW1 and SW2, and to switch off the switches SW3 and SW4, to make the input transistors M1 and M2 connect to the first circuit 112.

When the first stage amplifier circuit 110 operates in the high bandwidth mode, the input transistors M1 and M2 are coupled to the first circuit 112, and the first stage amplifier circuit 110 receives a differential input signal Vin and Vip to generate an amplified differential signal Vop1 and Von1; and when the first stage amplifier circuit 110 operates in the high gain mode, the input transistors M1 and M2 are coupled to the second circuit 114, the first stage amplifier circuit 110 receives a differential input signal Vin and Vip to generate an amplified differential signal Vop2 and Von2. Then, the inter-stage amplifier circuits 120_1-120_N generates a differential driving signal Vgp and Vgn according to the amplified differential signal Vop1/Vop2 and Von1/Von2. Then, the output stage 130 receives the differential driving signal Vgp and Vgn to generate an output signal Vout.

The output stage 130 comprises a first cascode circuit comprising a first output transistor Mo1 and a first buffer transistor Mb1, a second cascode circuit comprising a second output transistor Mo2 and a second buffer transistor Mb2, two operational amplifier 132 and 134, two transistors M7 and M8, and two switches SW5 and SW6. A source electrode of the first output transistor Mo1 is coupled to the supply voltage VDD, a source electrode of the first buffer transistor Mb1 is coupled between the first output transistor Mo1 and an output node of the output stage 130; a source electrode of the second output transistor Mo2 is coupled to a ground voltage GND, and the second buffer transistor Mb2 is coupled between the second output transistor Mo2 and the output node of the output stage 130. In addition, a positive input terminal of the operational amplifier 132 is coupled to a reference voltage Vrefp, a negative input terminal of the operational amplifier 132 is coupled to a drain electrode of the first output transistor Mo1 (i.e. a source electrode of the first buffer transistor Mb1), and a gate electrode of the first buffer transistor Mb1 is selectively connected to an output terminal of the operational amplifier 132, or to the ground voltage GND via the transistor M7. A negative input terminal of the operational amplifier 134 is coupled to a reference voltage Vrefn, a positive input terminal of the operational amplifier 134 is coupled to a drain electrode of the second output transistor Mo2 (i.e. a source electrode of the second buffer transistor Mb2), and a gate electrode of the second buffer transistor Mb2 is selectively connected to an output terminal of the operational amplifier 134, or to the supply voltage VDD via the transistor M8.

In this embodiment, to pull the bandwidth higher for the 4CCA (e.g. 100 MHz), the first output transistor Mo1 and the second output transistor Mo2 are implemented by core devices. In addition, because a voltage level of the supply voltage VDD is changed by referring to envelope tracking result, the first buffer transistor Mb1 and the second buffer transistor Mb2 are implemented by input/output (I/O) devices to protect the core devices. The core device and the I/O device are generated by different semiconductor processes, for example, the I/O device may have thicker gate oxide than the core device.

The linear amplifier 100 is applied in the envelope tracking module, and the supply voltage VDD is dynamically adjusted according to the envelope tracking result (i.e. the amplitude of the envelope). In this embodiment, a processor within the electronic device can obtain the envelope tracking result to determine a suitable level of the supply voltage VDD, and the processor further controls a buck-boost converter within the electronic device to generate the supply voltage VDD according to the determined level. Meanwhile, the control circuit 140 can obtain the information of the determined level of the supply voltage VDD from the processor to control the configuration of the output stage 130.

In detail, when the control circuit 140 receives the information that the supply voltage VDD is lower than a threshold voltage such as 2.0V, the control circuit 140 generates a control signal Vc1 to switch off the switch SW5, that is the gate electrode of the first buffer transistor Mb1 is connected to the ground voltage GND via the transistor M7 (it is assumed that the transistor M7 is turned on); and the control circuit 140 generates a control signal Vc2 to switch off the switch SW6, that is the gate electrode of the second buffer transistor Mb2 is connected to the supply voltage VDD via the transistor M8 (it is assumed that the transistor M8 is turned on). Because the gate electrode of the first buffer transistor Mb1 is connected to the ground voltage GND, and the gate electrode of the second buffer transistor Mb2 is connected to the supply voltage VDD, the first buffer transistor Mb1 and the second buffer amplifier are fully turned on and are able to be regarded as small resistors. Therefore, the output dynamic range of the output stage 130 is enlarged to achieve the better efficiency even if it is small output power.

When the control circuit 140 receives the information that the supply voltage VDD is larger than a threshold voltage such as 2.0V or 2.5V, the control circuit 140 generates the control signal Vc1 to switch on the switch SW5, that is the gate electrode of the first buffer transistor Mb1 is connected to the output terminal of the operational amplifier 132, and the source electrode of the first buffer transistor Mb1 is clamped at the reference voltage Vrefp; and the control circuit 140 further generates the control signal Vc2 to switch on the switch SW6, that is the gate electrode of the first buffer transistor Mb2 is connected to the output terminal of the operational amplifier 134, and the source electrode of the second buffer transistor Mb2 is clamped at the reference voltage Vrefn. Therefore, because the source electrode of the first buffer transistor Mb1 is clamped at the reference voltage Vrefp, and the source electrode of the second buffer transistor Mb2 is clamped at the reference voltage Vrefn, the first buffer transistor Mb1 and the second buffer transistor Mb2 will have the larger resistances (i.e. the drain-source cross voltage is larger) to prevent the first output transistor Mo1 and the second output transistor Mo2 (core devices) from having large drain-source cross voltage.

In light of above, when the supply voltage VDD is lower, the first buffer transistor Mb1 and the second buffer transistor Mb2 are controlled to be smaller resistors to enlarge the dynamic range of the output stage 130; and the when the supply voltage VDD is greater, the first buffer transistor Mb1 and the second buffer transistor Mb2 are controlled to have larger resistance to protect the core devices. Therefore, the output stage 130 can function well and efficiently even if the supply voltage VDD has a large operation range, such as 1.5V-5.2V.

Figure 2:
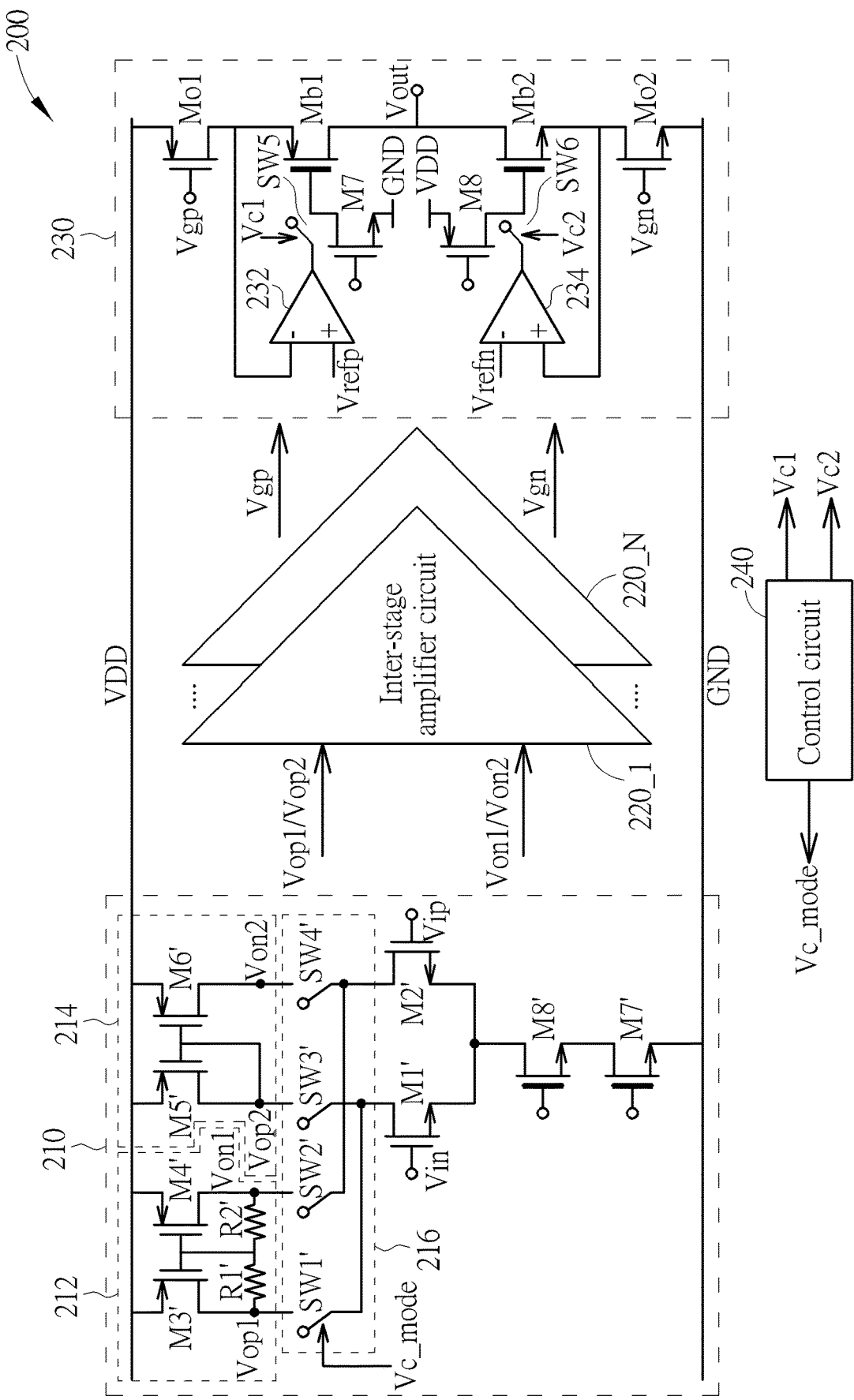
FIG. 2 is a diagram illustrative a linear amplifier according to another embodiment of the present invention.

FIG. 2 is a diagram illustrative a linear amplifier 200 according to another embodiment of the present invention. In this embodiment, the linear amplifier is a class AB amplifier used for an envelope tracking modulator in a power amplifier system. As shown in FIG. 2, the linear amplifier 200 comprises a first stage amplifier circuit 210, at least one inter-stage amplifier circuit (in this embodiment, inter-stage amplifier circuits 220_1-220_N) and an output stage 230. In the embodiment shown in FIG. 2, the first stage amplifier circuit 210 can selectively operate in a high bandwidth mode or a high gain mode for different applications, and the output stage 230 can have different dynamic ranges by referring to a voltage level of a supply voltage VDD, to optimize the efficiency of the power amplifier system.

The first stage amplifier circuit 210 comprises two input transistors M1' and M2', a first circuit 212, a second circuit 214 and a switch module 216, and two cascode transistors M7' and M8'. In this embodiment, the input transistors M1' and M2' connect to only one of the first circuit 212 and the second circuit 214 to make the first stage amplifier circuit 210 or the linear amplifier 200 to have different bandwidths and gains. In detail, the first circuit 212 comprises two transistors M3' and M4' and two resistors R1' and R2', where a drain electrode of the transistor M3' is coupled to a drain electrode of the input transistor M1' via a switch SW1' of the switch module 216, a drain electrode of the transistor M4' is coupled to a drain electrode of the input transistor M2' via a switch SW2' of the switch module 216, the resistor R1' is coupled between the drain electrode and a gate electrode of the transistor M3', and the resistor R2' is coupled between the drain electrode and a gate electrode of the transistor M4'. The second circuit 214 comprises two transistors M5' and M6', where a drain electrode of the transistor M5' is coupled to a drain electrode of the input transistor M1' via a switch SW3' of the switch module 216, and a drain electrode of the transistor M6' is coupled to a drain electrode of the input transistor M2' via a switch SW4' of the switch module 216. In this embodiment, because of the resistors R1' and R2', the equivalent impedance of the first circuit 212 is lower than the equivalent impedance of the second circuit 214. Therefore, because a dominate pole is determined by a transconductance (gm) of the input transistors M1' and M2' and the equivalent impedance of the first/second circuit 212/214, the first stage amplifier circuit 210 or the linear amplifier 200 has a higher bandwidth and lower gain when the input transistors M1' and M2' are coupled to the first circuit 212, and the first stage amplifier circuit 210 or the linear amplifier 200 has a narrower bandwidth and higher gain when the input transistors M1' and M2' are coupled to the second circuit 214.

In the 4G, 4G+ or pre-5G cellular system, the LTE has two system modes: TDD mode and FDD mode. The first stage amplifier circuit 210 is controlled to operate in the high gain mode when a cellular device comprising the linear amplifier 200 operates in the scenario which is sensitive to receiver band noise (e.g. FDD mode). In detail, when the linear amplifier 200 operates in the high gain mode, a control circuit 240 may generate a mode control signal Vc_mode to switch on the switches SW3' and SW4', and to switch off the switches SW1' and SW2', to make the input transistors M1' and M2' connect to the second circuit 214. In addition, for the contiguous carrier aggregation used for higher uplink data rate such as 2CCA, 3CCA and/or 4CCA (e.g. TDD mode), the high bandwidth and tracking capability are the main design consideration, and the first stage amplifier circuit 210 is controlled to operate in the high bandwidth mode. In detail, when the linear amplifier operates in the high bandwidth mode, the control circuit 240 may generate the mode control signal Vc_mode to switch on the switches SW1' and SW2', and to switch off the switches SW3' and SW4', to make the input transistors M1' and M2' connect to the first circuit 212.

When the first stage amplifier circuit 210 operates in the high bandwidth mode, the input transistors M1' and M2' are coupled to the first circuit 212, and the first stage amplifier circuit 210 receives a differential input signal Vin and Vip to generate an amplified differential signal Vop1 and Von1; and when the first stage amplifier circuit 210 operates in the high gain mode, the input transistors M1' and M2' are coupled to the second circuit 214, the first stage amplifier circuit 210 receives a differential input signal Vin and Vip to generate an amplified differential signal Vop2 and Von2. Then, the inter-stage amplifier circuits 220_1-220_N generates a differential driving signal Vgp and Vgn according to the amplified differential signal Vop1/Vop2 and Von1/Von2. Then, the output stage 230 receives the differential driving signal Vgp and Vgn to generate an output signal Vout.

The operations of the output stage 230 are the same as the operations of the output stage 130 shown in FIG. 1. A person skilled in the art should understand the operations of the output stage 230 after reading the aforementioned disclosure, further descriptions are therefore omitted here.

Briefly summarized, in the linear amplifier of the present invention, the first stage amplifier circuit can be selectively operated in the high gain mode or high bandwidth mode according to the operations or setting of the electronic device (such as FDD mode or TDD mode), and the output stage can be controlled to have large dynamic range when the supply voltage is low or the output stage may be controlled to protect the core devices when the supply voltage is high. Therefore, the efficiency of the linear amplifier and the power amplifier system can be optimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A linear amplifier, comprising:
   a first stage amplifier circuit, comprising:
      input circuits, for receiving differential input signals to generate amplified differential signals;

a first circuit;
a second circuit; and
a switch module, for coupling the input circuits to only one of the first circuit and the second circuit, wherein the input circuits are not coupled to the first circuit and the second circuit simultaneously;
wherein the input circuits are coupled to only one of the first circuit and the second circuit, and at least one of a bandwidth and a gain of the linear amplifier when the input circuits are coupled to the first circuit is different from the one of the bandwidth and the gain of the linear amplifier when the input circuits are coupled to the second circuit.

2. The linear amplifier of claim 1, wherein each of the input circuits is a transistor comprising a gate electrode, a first electrode and a second electrode, the gate electrode is used to receive the differential input signal, the first electrode is coupled to a supply voltage, and the second electrode is used to output the amplified differential signal; and the bandwidth and the gain of the linear amplifier when the second electrodes of the input circuits are coupled to the first circuit are different from the bandwidth and the gain of the linear amplifier when the second electrodes of the input circuits are coupled to the second circuit.

3. The linear amplifier of claim 1, wherein the linear amplifier has a higher bandwidth and lower gain when the input circuits are coupled to the first circuit than when the input circuits are coupled to the second circuit.

4. The linear amplifier of claim 3, wherein the linear amplifier is applied to a transceiver, and when the transceiver operates in a time division duplex (TDD) mode, the switch module is controlled to couple the input circuits to the first circuit to make the linear amplifier have the higher bandwidth; and when the transceiver operates in a frequency division duplex (FDD) mode, the switch module is controlled to couple the input circuits to the second circuit to make the linear amplifier have the higher gain.

5. The linear amplifier of claim 1, wherein when the first circuit and the second circuit have different equivalent impedances when it is coupled to the input circuits, to make the bandwidth and the gain of the linear amplifier when the input circuits are coupled to the first circuit are different from the bandwidth and the gain of the linear amplifier when the input circuits are coupled to the second circuit.

6. The linear amplifier of claim 5, wherein the first circuit has higher equivalent impedance than the second circuit, and the linear amplifier has a higher bandwidth and lower gain when the input circuits are coupled to the first circuit than when the input circuits are coupled to the second circuit.

7. The linear amplifier of claim 6, wherein each of the input circuits is a transistor comprising a gate electrode, a first electrode and a second electrode, the gate electrode is used to receive the differential input signal, the first electrode is coupled to a supply voltage, and the second electrode is used to output the amplified differential signal, and the first circuit comprises:
a first transistor, wherein a first electrode of the first transistor is selectively coupled to the second electrode of one of the input circuits via the switch module, a second electrode of the first transistor is coupled to another supply voltage, and a gate electrode the first transistor is connected to the first electrode via a resistor; and
a second transistor, wherein a first electrode of the second transistor is selectively coupled to the second electrode of the other one of the input circuits via the switch module, a second electrode of the second transistor is coupled to the other supply voltage, and a gate electrode the second transistor is connected to the first electrode via a resistor; and
the second circuit comprises:
a third transistor, wherein a first electrode of the third transistor is selectively coupled to the second electrode of one of the input circuits via the switch module, a second electrode of the third transistor is coupled to the other supply voltage, and a gate electrode the third transistor is directly connected to the first electrode; and
a fourth transistor, wherein a first electrode of the fourth transistor is selectively coupled to the second electrode of the other one of the input circuits via the switch module, a second electrode of the fourth transistor is coupled to the other supply voltage, and a gate electrode the fourth transistor is directly connected to the first electrode.

8. The linear amplifier of claim 1, further comprising:
at least one inter-stage amplifier circuit, for generating a differential driving signal according to the amplified differential signal; and
an output stage, coupled to the inter-stage amplifier circuit and supplied by the supply voltage, for generating an output signal according to the differential driving signal, wherein the output stage has a cascode structure whose dynamic range is controlled according to a level of the supply voltage.

9. The linear amplifier of claim 8, wherein the differential driving signal comprises a first driving signal and a second driving signal, and the output stage comprises:
a first cascode circuit, comprising:
a first output transistor, coupled to the supply voltage, for receiving the first driving signal; and
a first buffer transistor, coupled between the first output transistor and an output node of the output stage; and
a second cascode circuit, comprising:
a second output transistor, coupled to a ground voltage, for receiving the second driving signal; and
a second buffer transistor, coupled between the second output transistor and the output node of the output stage.

10. The linear amplifier of claim 9, further comprising:
a control circuit, for controlling the first buffer transistor to have different impedances by referring to the level of the supply voltage.

11. The linear amplifier of claim 10, wherein the control circuit controls the first buffer transistor to have lower impedance when the supply voltage is lower than a threshold voltage.

12. The linear amplifier of claim 11, wherein the first output transistor and the first buffer transistor are P-type metal-oxide semiconductors (PMOS), a source electrode of the first buffer transistor is coupled to a drain electrode of the first output transistor; and when the supply voltage is greater than a threshold voltage, the control circuit controls the source electrode of the first buffer transistor to have a reference voltage; and when the supply voltage is lower than the threshold voltage, the control circuit controls a gate electrode of the first buffer transistor to connect to the ground voltage.

13. The linear amplifier of claim 12, wherein the output stage further comprises:
an operational amplifier having a first input terminal, a second input terminal and an output terminal, wherein the first input terminal is coupled to the source electrode of the first buffer transistor, the second input terminal is coupled to the reference voltage; and a switch, for selectively connecting the gate electrode of the first buffer transistor to the output terminal of the operational amplifier or to the ground voltage by referring to the level of the supply voltage.

14. The linear amplifier of claim 9, wherein the first output transistor and the second output transistor are core devices, and the first buffer transistor and the second buffer transistor are input/output (I/O) devices.

15. A linear amplifier, comprising:

at least one amplifier circuit, for receiving an differential input signal to generate a differential driving signal; and an output stage, coupled to the amplifier circuit and supplied by a supply voltage, for generating an output signal according to the differential driving signal, wherein the output stage has a cascode structure whose dynamic range is controlled according to a level of the supply voltage;

wherein the differential driving signal comprises a first driving signal and a second driving signal, and the output stage comprises:

a first cascode circuit, comprising:
    a first output transistor, coupled to the supply voltage, for receiving the first driving signal; and
    a first buffer transistor, coupled between the first output transistor and an output node of the output stage; and a second cascode circuit, comprising:
    a second output transistor, coupled to a ground voltage, for receiving the second driving signal; and
    a second buffer transistor, coupled between the second output transistor and the output node of the output stage.

16. The linear amplifier of claim 15, further comprising:
    a control circuit, for controlling the first buffer transistor to have different impedances by referring to the level of the supply voltage.

17. The linear amplifier of claim 16, wherein the control circuit controls the first buffer transistor to have lower impedance when the supply voltage is lower than a threshold voltage.

18. The linear amplifier of claim 17, wherein the first output transistor and the first buffer transistor are P-type metal-oxide semiconductors (PMOS), a source electrode of the first buffer transistor is coupled to a drain electrode of the first output transistor; and when the supply voltage is greater than a threshold voltage, the control circuit controls the source electrode of the first buffer transistor to have a reference voltage; and when the supply voltage is lower than the threshold voltage, the control circuit controls a gate electrode of the first buffer transistor to connect to the ground voltage.

19. The linear amplifier of claim 18, wherein the output stage further comprises:

an operational amplifier having a first input terminal, a second input terminal and an output terminal, wherein the first input terminal is coupled to the source electrode of the first buffer transistor, the second input terminal is coupled to the reference voltage; and a switch, for selectively connecting the gate electrode of the first buffer transistor to the output terminal of the operational amplifier or to the ground voltage by referring to the level of the supply voltage.

20. The linear amplifier of claim 15, wherein the first output transistor and the second output transistor are core devices, and the first buffer transistor and the second buffer transistor are input/output (I/O) devices.

* * * * *